(12) United States Patent
Hay

(10) Patent No.: US 7,932,789 B2
(45) Date of Patent: Apr. 26, 2011

(54) FREQUENCY ADJUSTABLE SURFACE ACOUSTIC WAVE OSCILLATOR

(76) Inventor: Robert Hay, Boise, ID (US)

( * ) Notice: Subject to any disclaimer, the term of this patent is extended or adjusted under 35 U.S.C. 154(b) by 133 days.

(21) Appl. No.: 12/432,743

(22) Filed: Apr. 29, 2009

(65) Prior Publication Data

US 2009/0273404 A1    Nov. 5, 2009

Related U.S. Application Data

(60) Provisional application No. 61/050,113, filed on May 2, 2008.

(51) Int. Cl.
*H03B 5/36*    (2006.01)
(52) U.S. Cl. ............. 331/107 A; 333/193; 310/313 B
(58) Field of Classification Search .. 310/313 B–313 D; 333/193; 331/107 A
See application file for complete search history.

(56) References Cited

U.S. PATENT DOCUMENTS

| | | | |
|---|---|---|---|
| 3,686,518 | A | 8/1972 | Hartmann et al. |
| 3,723,919 | A | 3/1973 | Adler |
| 3,800,248 | A | 3/1974 | Speiser et al. |
| 3,831,116 | A | 8/1974 | Davis, Jr. et al. |
| 3,882,433 | A | 5/1975 | Subramanian |
| 4,024,480 | A | 5/1977 | Reeder et al. |
| 4,163,958 | A | 8/1979 | Gerard |
| 4,328,473 | A | 5/1982 | Montress et al. |
| 4,752,750 | A | 6/1988 | Zimmerman et al. |
| 5,874,866 | A * | 2/1999 | Satoh et al. ............ 331/107 A |
| 6,459,345 | B1 | 10/2002 | Kosinski et al. |
| 6,541,893 | B2 | 4/2003 | Zhu et al. |
| 7,291,959 | B2 * | 11/2007 | Miyazawa et al. ............ 310/358 |
| 2002/0021195 | A1 | 2/2002 | Takamine |

FOREIGN PATENT DOCUMENTS

WO    WO/01/58016    1/2001

OTHER PUBLICATIONS

Robert I. Amorosi and C. K. Campbell Studies of a Tunable SAW Oscillator Using a Differential SAW Delay Line with MOSFET Control IEEE vol SU-32 Jul. 4, 1985 p. 574-582.

Hikita, Sumioka, & Tabuchi A Wideband SAW Resonator and its Application to a VCO for Mobile Radio Tansceivers IEEE Trans. on Vehic. Technology vol. 43 No. 4 Nov. 1994 p. 863-869.

Kenny, Park, Hunt & Kenney Wideband Programmable SAW Filters 2001 IEEE Ultrasonics Symposium p. 89-92.

Zhu, Emanetoglu, Lu Kosinski, & Pastore A Multi IDT Input Tunable SAW Filter IEEE Transactions on Ultrasonics vol. 48 No. 5 Sep. 2001 p. 1383-1388.

(Continued)

*Primary Examiner* — Robert Pascal
*Assistant Examiner* — James E Goodley
(74) *Attorney, Agent, or Firm* — Gerald Carlson, Agent

(57) ABSTRACT

A frequency adjustable surface acoustic wave oscillator uses circuitry in which the phase relationship between the corresponding input and output signals and the voltage applied to or received by transducer fingers is controlled in such a manner that the frequency of the surface acoustic wave oscillator is arbitrarily controlled over a wide range by digital means. This provides an oscillator that exhibits a wide tunable frequency range while providing low phase noise.

22 Claims, 7 Drawing Sheets

OTHER PUBLICATIONS

Montress, Parker, Kress, & Kosinski Design and Perfromance of a Low Noise Wide Tuning Range AQP SAW Delay Line VCO 1992 IEEE Frequency Control Symposium p. 356-370.

Pastore & Kosinski An Improved Tunable Filter Topology for HF Preselection 1998 IEEE International Frequency Control Symposium p. 575-579.

Eo, Hyun, Lee, Oh, Lee Reference SAW Oscillator on QoS Wafer for Polylithic Integration of True Single Chip Radio IEEE Electron Device Letters vol. 21, No. 8, Aug. 2000 p. 393-395.

Roger Tancrell Analytic Design of Surface Wave Bandpass Filters IEEE Transactions on Sonics and Ultrasonics vol. SU-21, No. 1, Jan. 1974 p. 12-21.

V. Ermolov & M. Luukkala Tunable SAW Comb Filter Electronics Letters, Aug. 29, 1991, vol. 27 No. 18, p. 1670-1671.

Van Rhijn, Lubking, & Haarsten A Fully Silicon Integrated SAW Programmable Transversal Filter with Programming/Read-out Circuitry 1991 IEEE Ultrasonics Symposium p. 89-94.

* cited by examiner

FREQUENCY ADJUSTABLE SURFACE ACOUSTIC WAVE OSCILLATOR

CROSS REFERENCE TO RELATED APPLICATIONS

This application claims the benefit of the provisional application entitled "Digitally Tunable Surface Acoustic Wave Device" by Robert Hay, application Ser. No. 61/050113 filed May 2, 2008, and is hereby incorporated by reference in its entirety.

FEDERALLY SPONSORED RESEARCH OR DEVELOPMENT

Not applicable.

JOINT RESEARCH AGREEMENT

Not applicable

SEQUENCE LISTING

Not applicable

FIELD OF THE INVENTION

The present invention relates to the field of surface acoustic wave (SAW) devices and in particular to digitally tunable oscillators using SAW devices.

BACKGROUND OF THE INVENTION

Surface Acoustic Wave (SAW) devices are frequently used as filters, signal processing components, and as the resonating components of oscillators for generating sinusoid signals. Use of these devices is typically limited to applications where a fixed or slightly tunable frequency response is suitable.

In contrast to a Bulk Acoustic Wave (BAW) device where the resonant frequency is generally determined almost exclusively by the physical properties and geometry of the piezoelectric material, the bandpass frequency and propagation delay properties of a particular SAW device are largely influenced by the mechanism by which signals are applied to and extracted from the piezoelectric substrate as well as the material properties. This mechanism is traditionally determined by a fixed metallization pattern known as the interdigitated transducer (IDT) which contains a single pair of connection terminals for the input signal and a similar pair of terminals for the output signal. A typical SAW device contains a sending and a receiving IDT.

Because of their elongated parallel structure, the interdigitated transducers (IDT) are also referred to as transducer fingers or just "fingers".

SUMMARY OF THE INVENTION

The frequency adjustable SAW oscillator uses circuitry in which the phase relationship between the corresponding input and output signals and the voltage applied to or received by subsets of the transducer fingers is controlled in such a manner that the bandpass frequency of the SAW device is arbitrarily controlled over a wide range by digital means. This provides an oscillator that exhibits a wide tunable frequency range while providing low phase noise.

In one embodiment transmitting fingers interface with a portion of piezoelectric material and initiate a surface acoustic wave on the piezoelectric material. Receiving fingers, configured to receive the surface acoustic wave, interface with a second portion of the piezoelectric material and generate an electrical signal. Phase adjustable drivers connect to and drive each of the transmitting fingers. Phase adjustable receivers connect to each of the receiving fingers. A receiver summing network sums the receiver output from each of the phase adjustable receivers and produces a receiver summed output. A gain element amplifies the summed output and excites each of the phase adjustable drivers.

In another embodiment the frequency adjustable surface acoustic wave oscillator has a piezoelectric layer deposited onto a semiconductor. Transmitting fingers interface with a first portion of the piezoelectric layer, and initiate a surface acoustic wave on the piezoelectric layer. Receiving fingers interface with a second portion of the piezoelectric layer and receive the surface acoustic wave. Phase adjustable drivers sum phase-shifted versions of an input signal via transmission gates or switches and drive each of the transmitting fingers. Phase adjustable receivers connect multiple receiver transmission gates or switches to each receiver finger via a buffer. The output of each of the receiver transmission gates or switches connects to one of a multitude of receiver busses. A receiver summing system receives a phase-shifted version of each of the receiver busses and forms a summed output. A gain element receives the summed output and excites the input signal.

A method of implementing the frequency adjustable surface acoustic wave oscillator employs transmitting and receiving fingers adapted to transmit and receive respectively surface acoustic waves on a piezoelectric surface. A surface acoustic wave is transmitted onto the piezoelectric surface by controlling the phase of an input signal to each of the transmitting fingers. The receiving fingers receive the surface acoustic wave and produce a multitude of received signals. The phase of each of the received signals is adjusted. The phase-adjusted received signals are then summed. The resulting sum is amplified to generate the input signal. The input signal is then phase adjusted and applied to the transmitting fingers as described above.

BRIEF DESCRIPTION OF DRAWINGS

The summary above, and the following detailed description will be better understood in view of the enclosed drawings which depict details of various embodiments. Like reference numbers designate like elements. It should however be noted that the invention is not limited to the precise arrangement shown in the drawings. The features, functions and advantages can be achieved independently in various embodiments of the claimed invention or may be combined in yet other embodiments.

DETAILED DESCRIPTION

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention, and it is to be understood that modification to the various disclosed embodiments may be made and other embodiments may be utilized, without departing from the spirit and scope of the present invention. The following detailed description is therefore, not to be taken in a limiting sense.

Figure 1:
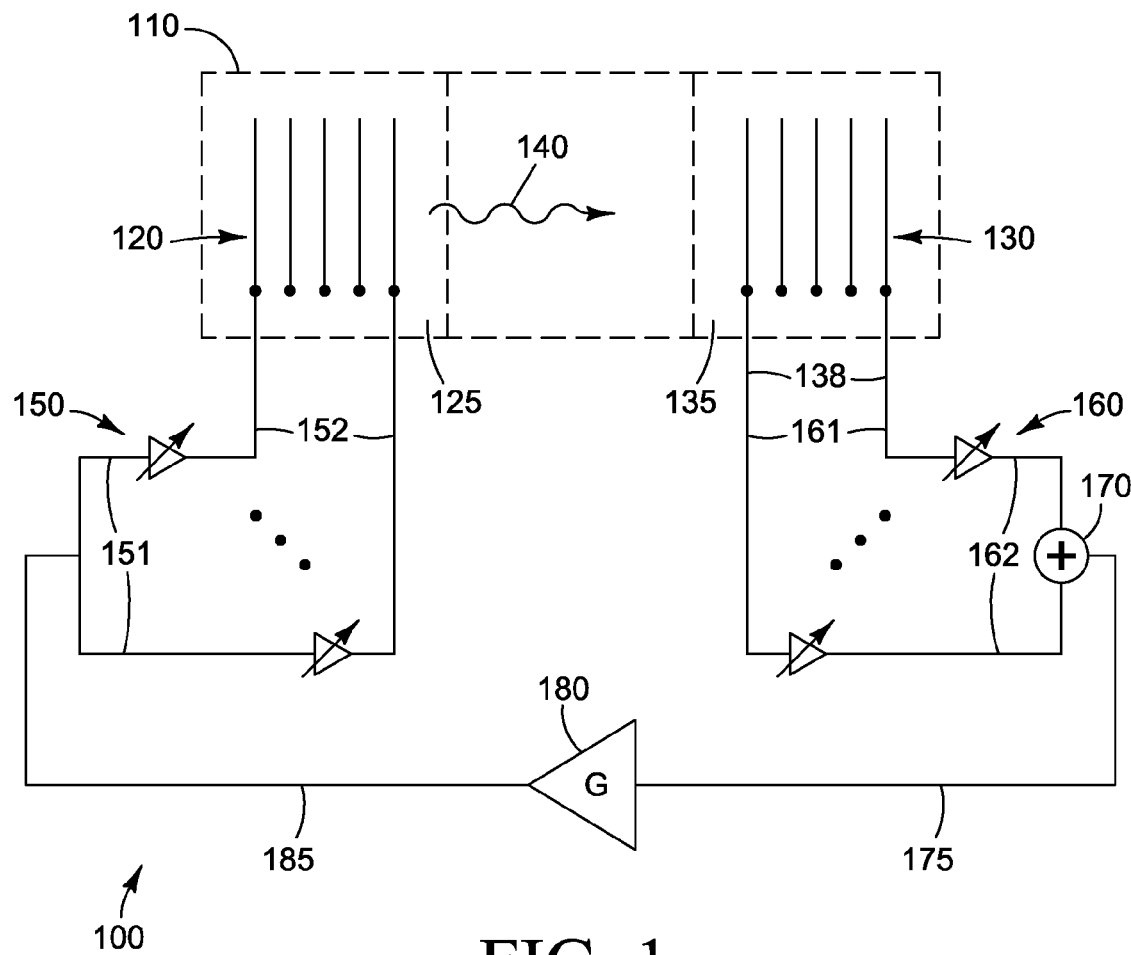
FIG. 1 shows one embodiment of the frequency adjustable surface acoustic wave oscillator.

FIG. 1 shows one embodiment of the frequency adjustable surface acoustic wave oscillator 100. A piezoelectric material 110 has a number of transmitting fingers 120 interfacing with a first portion of the piezoelectric material 125. The transmitting fingers 120 are configured to initiate a surface acoustic wave 140 on the piezoelectric material 110. A number of receiving fingers 130 interface with a second portion of the piezoelectric material 135.

The receiving fingers 130 are configured to receive the surface acoustic wave 140 and generate an electrical signal 138. Phase adjustable drivers 150, each have a driver input 151 and a driver output 152. The driver output 152 of each of the phase adjustable drivers 150 connects to one of the transmitting fingers 120.

Each of the phase adjustable receivers 160 has a receiver input 161 and a receiver output 162. Each of the receiver inputs 161 connects to one of the receiving fingers 130. The inputs of a receiver summing network 170 connect to the receiver outputs 162 from each of the phase adjustable receivers 160. The output of the receiver summing network 170 produces a receiver summed output 175. A gain element 180 receives the summed output 175. The output 185 of the gain element 180 connects to each of the driver inputs 151.

In operation, the output 185 of the gain element 180 excites the driver inputs 151 of the phase adjustable drivers 150. Each of the driver outputs 152, provides a phase adjusted signal to one of the transmitting fingers 120. The transmitting fingers 120 interface with a first portion 125 of the piezoelectric material 110 and initiate a surface acoustic wave 140 on the piezoelectric material 110. The receiving fingers 130 interface with a second portion of the piezoelectric material 135. The receiving fingers 130 receive the surface acoustic wave 140 and generate electrical signals 138. The phase adjustable receivers 160 each receive an electrical signal 138 from a receiving finger 130 at receiver input 161. The receiver summing network 170 sums the receiver outputs 162 from each of the phase adjustable receivers 160 and produces a receiver summed output 175. The gain element 180 amplifies the summed output 175 and excites each of the driver inputs 151.

The piezoelectric material 110 of FIG. 1 can be any number of commonly known piezoelectric materials. Examples include, but are not limited to, zinc oxide, quartz, lithium tantalate, lithium niobate, gallium arsenide, cadmium sulphide, lithium tetraborate, langasite, bismuth germanium oxide, and aluminum nitride. The various piezoelectric materials have different properties including propagation speed of the acoustic wave, loss characteristics, and temperature coefficient. Those skilled in the art of surface acoustic wave devices choose the piezoelectric material based on the specific application.

In some embodiments all the electronic components of FIG. 1 including the phase adjustable drivers 150, phase adjustable receivers 160, summing network 170, gain element 180 and their associated buffers and interconnections are built on a common semiconductor substrate 600 (FIG. 6). In yet other embodiments the piezoelectric material 110 is deposited onto the surface of the semiconductor substrate 600 (FIG. 6). There may be an underlying dielectric layer 610 between the semiconductor substrate 600 and the piezoelectric material 110. This may be chosen based on several criteria including hardness, passivation properties, semiconductor process and propagation velocity. A range of materials are suitable for the dielectric material 610 ranging from silicon dioxide, silicon nitride, or a diamond-like carbon. Additional details are presented in conjunction with FIG. 6.

Figure 2:
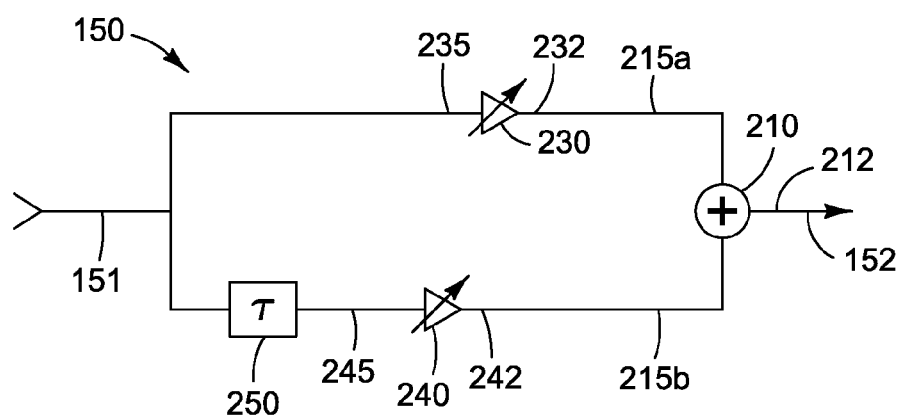
FIG. 2 shows one embodiment of a phase adjustable driver.

FIG. 2 shows one embodiment of the phase adjustable drivers 150 of FIG. 1. A driver summing block 210 has inputs 215*a*, 215*b* and an output 212. A first adjustable gain amplifier 230 has an input 235 and an output 232. The input 235 connects to the driver input 151. The output 232 connects to an input 215*a* of the driver summing block 210. A second adjustable gain amplifier 240 has an input 245 and an output 242. The input 245 connects to the driver input 151 via a phase-shifter 250. The output 242 connects to an input 215*b* of the driver summing block 210. The output 212 of the driver summing block 210 connects to the output 152 of the phase adjustable driver 150.

In operation the phase adjustable driver 150 receives the driver input 151 at the input 235 of the first adjustable gain amplifier 230 and a phase shifted version of input 151 via the phase-shifter 250 at the input 245 of the second adjustable gain amplifier 240. In some embodiments the phase-shifter 250 is chosen to provide a 90 degree phase shift of the signal at input 151. The phase shift of phase-shifter 250 can be accomplished in a number of ways. In some embodiments, the phase shifter 250 is implemented as a delay element. In other embodiments the phase-shifter is a power splitter/combiner or hybrid coupler known to those skilled in the art. The driver summing block 210 adds the amplifier outputs 232 and 242 received at the summer inputs 215*a* and 215*b*. Each of the adjustable gain amplifiers 230 and 240 have a gain that varies from negative through zero to positive. In this example the phase-shifter 250 provides a phase shift of 90 degrees. For example assume the signal on input 151 has an amplitude of 1 and a reference phase of 0 degrees. Amplifier 230 can produce a signal on output 232 ranging from 1 to −1 where −1 represents an amplitude of 1 with a phase shift of 180 degrees. In a similar manner amplifier 240 can produce a signal on output 242 ranging from amplitude of 1 at 90 degrees to 1 at 270 degrees. When the signals at outputs 232 and 242 are added by the summer block 210, the phase of the signal at output 212 can range from 0 degrees to 360 degrees. This variable phase signal connects to the phase adjustable driver output 152 and drives the transmitting fingers 120 of FIG. 1

Figure 3:
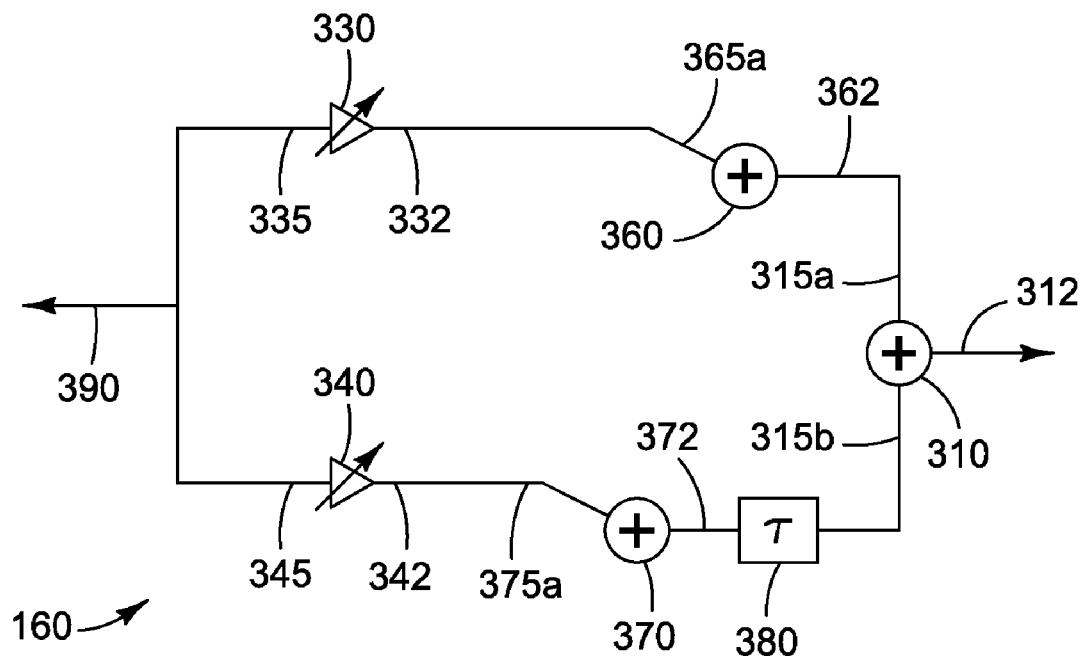
FIG. 3 shows one embodiment of a phase adjustable receiver.

FIG. 3 shows one embodiment of the phase adjustable receivers 160 of FIG. 1. A common in-phase summing block 360 has input 365*a* and an output 362. A common phase-shifted summing block 370 has input 375*a* and an output 372. A receiver summing block 310 has inputs 315*a* and 315*b* and an output 312. The output 362 connects to the input 315*a* and the output 372 connects to the input 315b via a delay phase-shifter 380. Two adjustable gain amplifiers 330 and 340 have inputs 335 and 345 respectively and connect to one of the plurality of receiving fingers 130 of FIG. 1 via node 390. The output 332 of adjustable gain amplifier 330 connects to an input 365a of the common in-phase summing block 360; and the output 342 of the adjustable gain amplifier 340 connects to input 375a of the common phase-shifted summing block 370.

In operation the two adjustable gain amplifiers 330 and 340 receive the signal from one of the receiving fingers 130 of FIG. 1 at node 390 via inputs 335 and 345. The adjustable gain amplifiers 330 and 340 have a gain that ranges from negative through zero to positive. The output 332 of adjustable gain amplifier 330 is added to the output of other adjustable gain amplifiers (not shown) by common in-phase summing block 360. Similarly the output 342 of adjustable gain amplifier 340 is added to the output of other adjustable gain amplifiers (not shown) by common phase-shifted summing block 370. Receiver summing block 310 adds the output 362 of common in-phase summing block 360 to the output 372 of phase-shifted summing block 370 via its inputs 315a and 315b after it is shifted in phase by the phase-shifter 380. In some embodiments the delay phase-shifter 380 is chosen to provide a 90 degree phase shift of the signal at output 372. The phase shift of phase-shifter 380 can be accomplished in a number of ways. In some embodiments, the phase shifter 380 is implemented as a delay element. In other embodiments the phase-shifter 380 is a power splitter/combiner or hybrid coupler known to those skilled in the art. When the phase shifter 380 provides a 90 degree phase shift, the received signal at node 390 can be adjusted in phase from 0 to 360 degrees by adjusting the gain of the amplifiers 330 and 340. The phase adjusted output appears at the summed output 312.

The common in-phase summing block 360 and common phase-shifted summing block 370 of FIG. 3 are shared by a number of adjustable gain amplifiers. In practice each of the summing blocks 360 and 370 have multiple inputs. These other inputs, not shown, receive the outputs of the adjustable gain amplifiers associated with other receiving fingers 130 of FIG. 1. In some embodiments the phase shifter 380 is implemented with a delay that approximates a 90 degree or quadrature phase shift. When phase-shifter 380 is implemented with a delay, the degree of phase shift will vary as a function of the input signal frequency at node 390. Some implementations have a tapped delay or adjustable delay to more accurately control the phase shift. The adjustable gain of the amplifiers 330 and 340 can compensate for variations of the phase shifter from 90 degrees.

Figure 4:
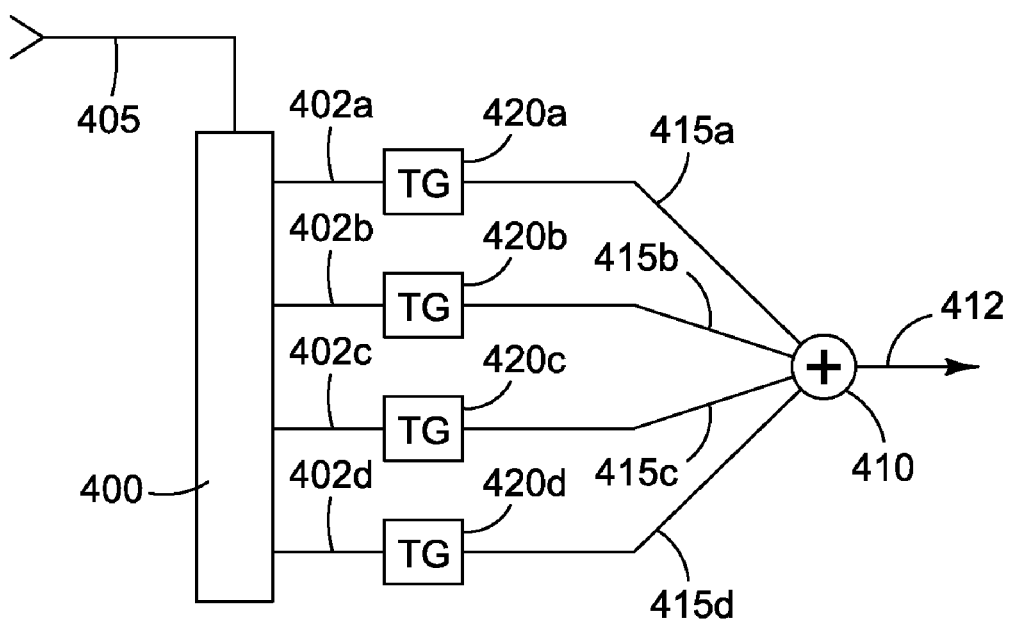
FIG. 4 shows another embodiment of a phase adjustable driver.

FIG. 4 shows another embodiment of the phase adjustable drivers 150 of FIG. 1. A tapped delay 400 has an input 405 that connects to the phase adjustable driver input 151 of FIG. 1. A number of taps 402a-d present delayed versions of the input 405 to the inputs of switches 420a-d. Each of the switches 420a-d is interposed between one of the taps 402a-d of the tapped delay line 400, and one of the inputs 415a-d of the summing block 410. In this embodiment the switches 420a-d are represented as transmission gates. The output of the summing block 412 connects to the output of the phase adjustable driver 152 of FIG. 1.

In operation the taps 402a-d of the delay line 400, output delayed versions of the input 405. In some embodiments, the delays represent phase shifts of 0, 90, 180 and 270 degrees of the input 405 which is connected to the driver input 151 of FIG. 1. The switches 420a-d, control whether the signals on the taps 402a-d are inputted to the inputs 415a-d of the summing block 410. Each of the switches 420a-d has a control input, not shown, that allows the switch to either pass or not pass the signal from its respective tap 402a-d to its respective summing block input 415a-d. The summing block 410 adds the signals present at the inputs 415a-d and outputs the sum on the output 412 of the summing block 410. The output 412 connects to the output of the phase adjustable driver 152 of FIG. 1 ultimately driving a transmitting finger 120 of FIG. 1.

In embodiments where the four taps 402a-d represent phase shifts of 0, 90, 180 and 270 degrees, eight unique combinations are available at output 412. The table below shows how phase shifted versions of the input 405 are possible at the output 412 by turning on one or two switches 420a-d at a time.

| 420a | 420b | 420c | 420d | Output 412 |
|------|------|------|------|------------|
| 1 | 0 | 0 | 0 | 0 degrees |
| 1 | 1 | 0 | 0 | 45 degrees |
| 0 | 1 | 0 | 0 | 90 degrees |
| 0 | 1 | 1 | 0 | 135 degrees |
| 0 | 0 | 1 | 0 | 180 degrees |
| 0 | 0 | 1 | 1 | 225 degrees |
| 0 | 0 | 0 | 1 | 270 degrees |
| 1 | 0 | 0 | 1 | 315 degrees |

In the table above, a 1 indicates that the control to the respective switch is on allowing the switch to pass a signal from its input to its output. A 0 indicates that the control to the respective switch is off preventing the signal from passing from the switch input to output. The eight phase angles above may be suitable in some applications instead of the more complex variable gain amplifiers 230 and 240 of FIGS. 2 and 3. Many variations of FIG. 4 are possible. For example, while four delays are shown in FIG. 4, other numbers of delays are possible. Another embodiment may employ eight taps and eight switches feeding a summer with eight inputs. This alternative embodiment enables more phase resolution. Additionally, since the phase shift associated with a particular delay depends on the frequency of the input signal, a larger number of taps increases the range of frequencies covered.

The tapped delay 400 of FIG. 4 is shown in conjunction with one phase adjustable driver. In many embodiments, a single tapped delay is employed by all the phase adjustable drivers. Suitable buffering between the taps and the switches prevents the effect of loading the taps by the switches. The embodiment depicted in FIG. 4 uses transmission gates as switches. Other embodiments can use other types of switches including, but not limited to, diode switches or other types of semiconductor switches.

Each of the switches, represented by transmission gates 420a-d in FIG. 4 has one of two states, either open, not passing a signal, or closed, passing a signal. This binary nature, either open or closed, on or off, lends itself to digital control. A single binary bit can control each switch. A series of binary bits can control each of the adjustable phase drivers. A designer can increase or decrease the number of taps and switches depending upon the application. The control bits can be shifted into the circuit by a serial bit stream into shift registers. The approach of programming the switches by means of a series of binary bits allows flexibility in the overall design.

Figure 5:
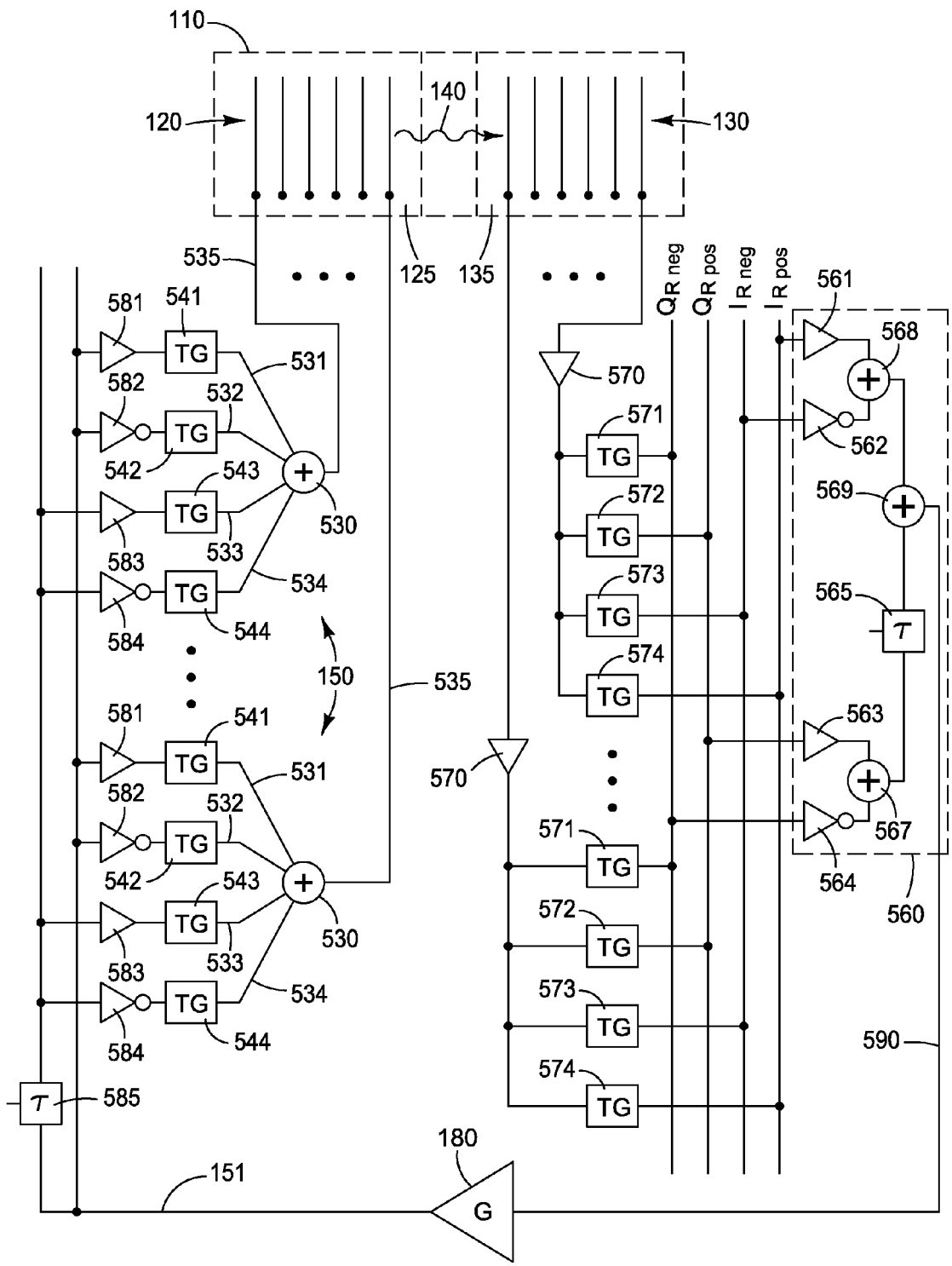
FIG. 5 shows another embodiment of the frequency adjustable surface acoustic wave oscillator.

FIG. 5 shows another embodiment of the frequency adjustable surface acoustic wave oscillator. A piezoelectric layer 110 is deposited onto a semiconductor 600 (FIG. 6). Transmitting fingers 120 interface with a first portion 125 of the piezoelectric layer 110. The transmitting fingers 120 are configured to initiate a surface acoustic wave 140 on the piezoelectric layer 110. Receiving fingers 130 interface with a second portion 135 of the piezoelectric layer 110. The receiving fingers 130 are configured to receive the surface acoustic wave 140. Phase adjustable drivers 150, each have a summer 530 with summer output 535 and summer inputs 531-534. The summer outputs 535 connect to a corresponding one of the transmitting fingers 120. Each of the summer inputs 531-534 receives a version of an input signal 151 via switches 541-544, buffers 581-584 and phase-shifter 585. Receiver busses QRneg, QRpos, IRneg, and IRpos feed a receiver summing system 560. The receiver summing system 560 uses buffers 561-564, phase-shifter 565 and summers 567-569 to form phase-shifted versions of the receiver busses QRneg, QRpos, IRneg, and IRpos. These phase-shifted versions of the busses QRneg, QRpos, IRneg, and IRpos represent various phases of the signal on the receiving finger 130. The receiver summing system 560 generates a summed output 590. Receiver switches 571-574 and buffer 570 make up each phase adjustable receiver. The inputs of the receiver switches 571-574 connect to one receiver finger via a buffer 570, the output of each of the receiver switches connect to one of the receiver busses QRneg, QRpos, IRneg, and IRpos. A gain element 180 receives the summed output 590 and excites the input signal 151.

In operation the phase adjustable drivers 150, each receive four versions of the input 151. Input 531, representing a 0 degree phase shift, receives a non-inverted, minimally delayed version of input 151 via buffer 581 and switch 541. Input 532, representing a 180 degree phase shift receives an inverted, version of input 151 via inverting buffer 582 and switch 542. Input 533, representing a 90 degree phase shift, receives a non-inverted, phase-shifted version of input 151 via phase-shifter 585, buffer 583, and switch 543. Input 534, representing a 270 degree phase shift, receives an inverted, phase-shifted version of input 151 via phase-shifter 585, inverting buffer 584, and switch 544. A summer 530 adds the summer inputs 531-534. The summer output 535 drives a corresponding one of the transmitting fingers 120. The transmitting fingers 120 initiate an acoustic wave 140 onto the piezoelectric layer 110. Receiving fingers 130 interface with a second portion 135 of the piezoelectric layer 110 and receive the surface acoustic wave 140. The inputs of the receiver switches 571-574 receive the signal from receiver fingers 130 via a buffer 570. The output of each of the receiver switches 571-574 drives one of the receiver busses QRneg, QRpos, IRneg, and IRpos. The receiver summing system 560 adds a phase-shifted or buffered version of each of the receiver busses QRneg, QRpos, IRneg, and IRpos and outputs a signal 590. IRpos, is buffered by buffer 561 and is added to summed output 590 by summers 568 and 569. IRpos represents a 0 degree phase shift of the signal at receiving finger 130. IRneg, is inverted by inverting buffer 562 and is added to summed output 590 by summers 568 and 569. IRneg represents a 180 degree phase shift of the signal at receiving finger 130. QRpos, is buffered by buffer 563, phase-shifted by phase-shifter 565 and is added to summed output 590 by summers 567 and 569. QRpos represents a 90 degree phase shift of the signal at receiving finger 130. QRneg, is inverted by inverting buffer 564, phase-shifted by phase-shifter 565 and is added to summed output 590 by summers 567 and 569. QRneg represents a 270 degree phase shift of the signal at receiving finger 130. A gain element 180 amplifies the summed output 590 and excites the input signal 151.

The phase of the transmitting fingers 120 of FIG. 5 are controlled by enabling or disabling each of the switches 541-544. Similar to the discussion of FIG. 4, the embodiment shown in FIG. 5 has eight possible phase angles for each of the phase adjustable drivers 150. Control bits, not shown, set each of the switches 541-544 to open or closed. The various combinations of the four switches enable phases of 0, 45, 90, 135, 180, 225, 270, and 315 degrees when the phase-shifter 585 corresponds to a 90 degree phase shift. Other embodiments are possible by increasing or decreasing the number of phase-shifters and switches. The phase-shifter 585 itself may also be programmable to expand the frequency range of the overall system. The phase shift of phase-shifters 565 and 585 can be accomplished in a number of ways. In some embodiments, the phase shifters 565 and 585 are implemented as delay elements. In other embodiments the phase-shifters are power splitters/combiners or hybrid couplers known to those skilled in the art.

Figure 6A:
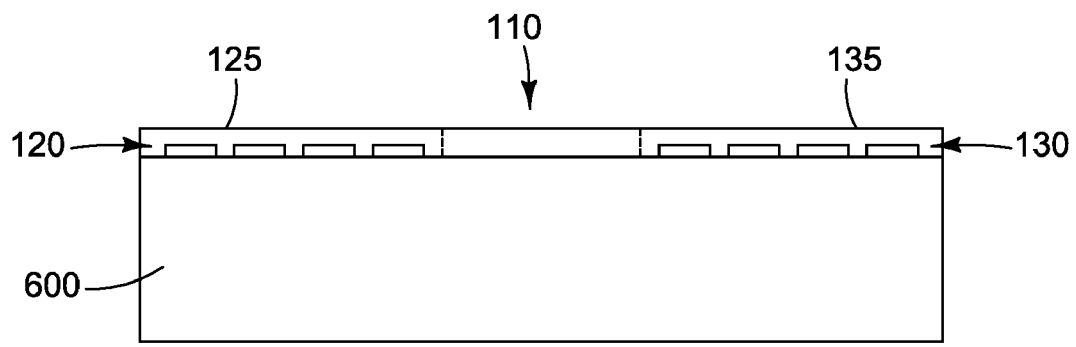
FIG. 6A shows a profile view of one embodiment of the frequency adjustable surface acoustic wave oscillator.

FIG. 6A shows a profile view of a semiconductor material 600. A piezoelectric material 110 is deposited on top of the semiconductor material 600. In some embodiments the buffers, amplifiers, delays, phase-shifters, summers, connections, and switches are fabricated in or on the semiconductor material 600. The transmitting fingers 120 interface with a portion 125 of the piezoelectric material 110 while the receiving fingers 130 interface with a portion 135 of the piezoelectric material 110. In some embodiments the fingers 120 and 130 are part of the metal layers associated with the semiconductor process.

Figure 6B:
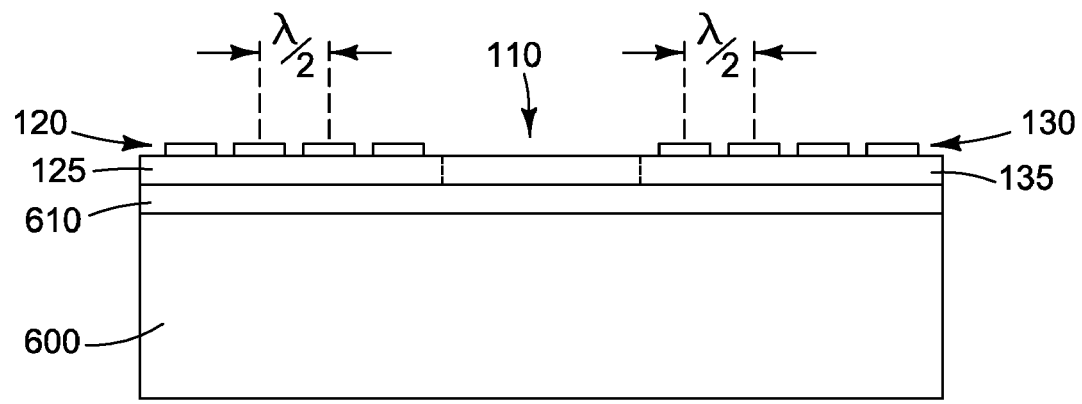
FIG. 6B shows a profile view of another embodiment of the frequency adjustable surface acoustic wave oscillator.

FIG. 6B shows a profile view of a semiconductor material 600. A dielectric layer 610 is deposited on top of the semiconductor material 600. A piezoelectric material 110 is deposited on top of the dielectric layer 610. In some embodiments the buffers, amplifiers, phase-shifters, summers, connections, and switches are fabricated in or on the semiconductor material 600. The transmitting fingers 120 interface with a portion 125 of the piezoelectric material 110 while the receiving fingers 130 interface with a portion 135 of the piezoelectric material 110. In some embodiments the fingers 120 and 130 are deposited as a separate metal layer. Connections between the fingers 120 and 130 and associated components on the semiconductor process are realized with feed throughs or other methods known to those skilled in the art of semiconductor processes.

In FIG. 6B, the spacing between the transmitting and receiving fingers 120 and 130 is shown as lambda/2. In some embodiments, lambda is chosen as the geometric mean of the wavelengths of the highest and lowest frequencies of the frequency adjustable SAW oscillator. Consider for example a lowest frequency of 100 MHz, a highest frequency of 200 MHz and a propagation speed of an acoustic wave of 3000 meters/second. The geometric mean of the two frequencies is (100 MHz*200 MHz)^0.5=141.4 MHz. The wavelength of 141.4 MHz on a 3000 meter/second piezoelectric material is 3000/141.4 MHz=21.2 micrometers. The spacing between adjacent transmitting or receiving fingers 120 or 130 is half of this value or 10.6 micrometers. Other embodiments may employ other spacings.

Figure 7:
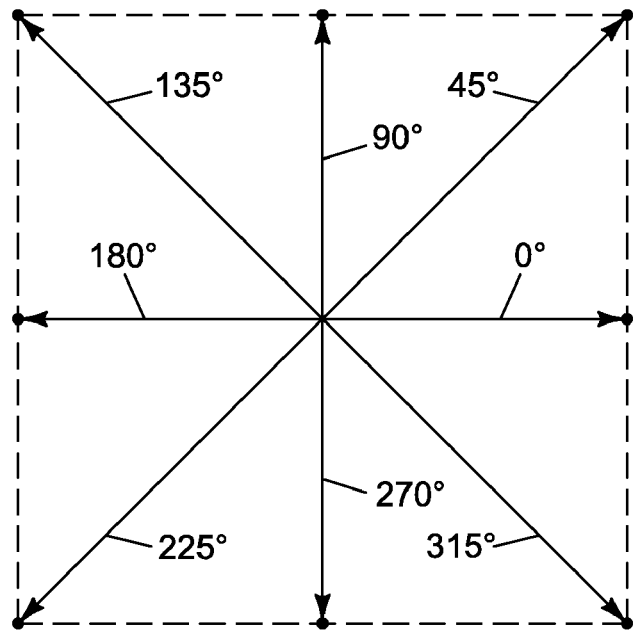
FIG. 7 shows an example of phase addition.

FIG. 7 shows a graphical representation of the phases available from the embodiment presented in FIG. 5. The phases of 0, 90, 180 and 270 are available from the buffers 581, 582, 583, and 584 respectively when the phase-shifter 585 provides a 90 phase shift of the input signal 151. By vector addition, the phase 45 is obtained by the addition of phases 0 and 90; 135 is obtained by the addition of phases 90 and 180; 225 is obtained by the addition of phases 180 and 270; and 315 is obtained by the addition of phases 270 and 0. Additional phases are possible in other embodiments by changing the value of the phase-shifter 585 or adding additional phase-shifters and switches.

Figure 8A:
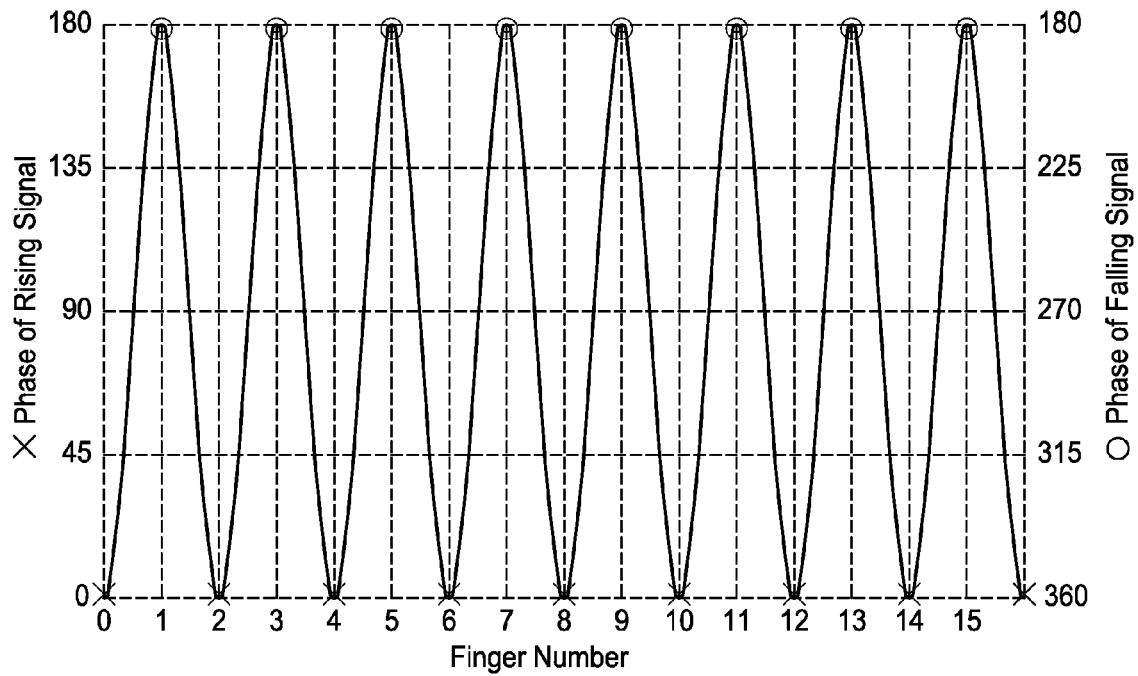
FIG. 8A depicts a mid frequency waveform superimposed on a set of interdigitated fingers.
Figure 8B:
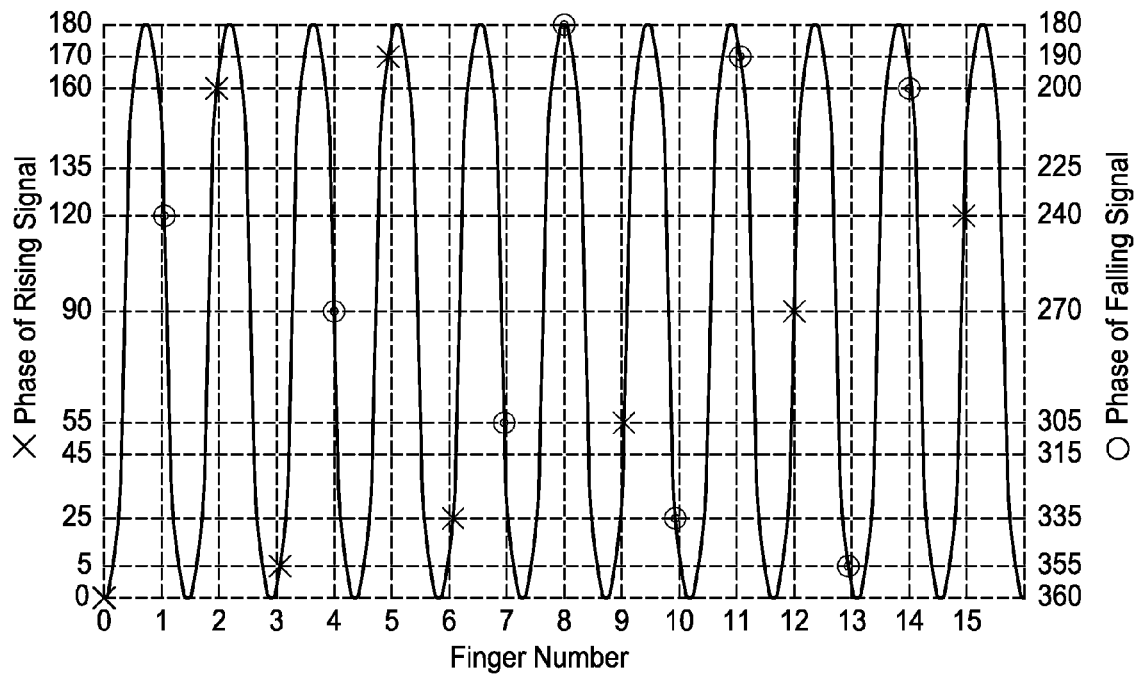
FIG. 8B depicts a high frequency waveform superimposed on a set of interdigitated fingers.
Figure 8C:
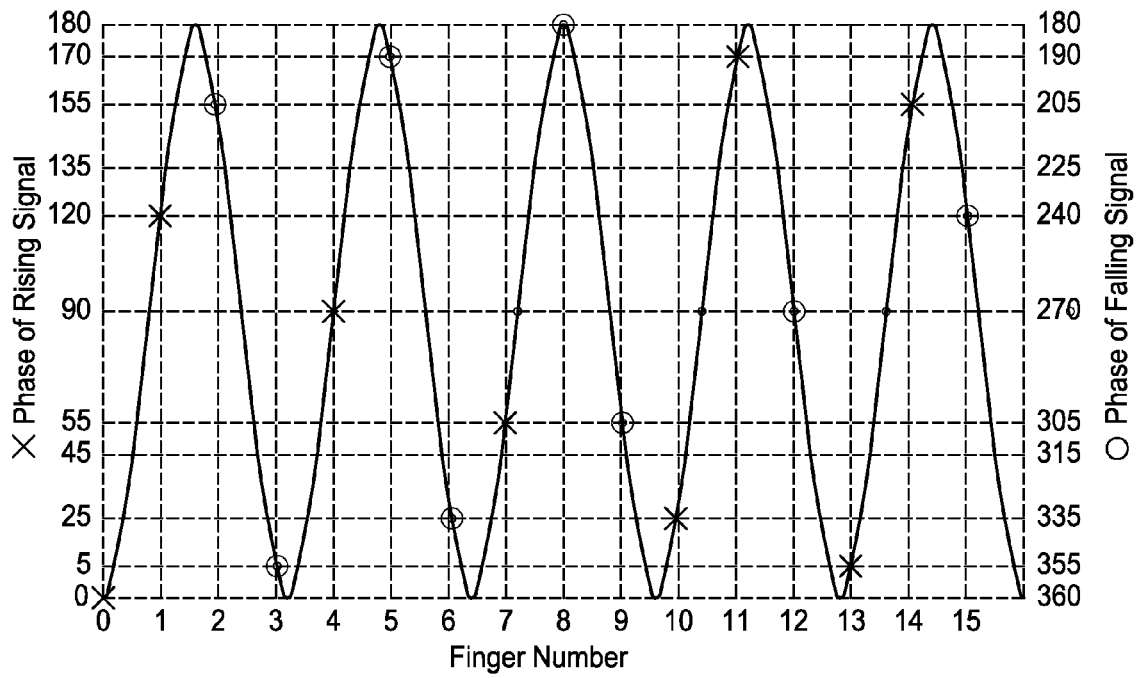
FIG. 8C depicts a low frequency waveform superimposed on a set of interdigitated fingers.

FIGS. 8A, 8B and 8C show a graphical means to determine the phase for each finger given a desired frequency. The figures depict a set of 16 fingers 0-15 spaced equally apart. The dashed vertical lines represent the centerline of each finger. The spacing between fingers is scaled to represent the half wavelength discussed earlier. A sine wave superimposed on the fingers represents the desired frequency. The sine wave is scaled to the match the scale used to space the fingers. The left side of the graph is labeled 0, 45, 90, 135 and 180 and represents the phases for the ascending portion of the sine wave. The right side of the graph is labeled 180, 225, 270 and 315 and represents the phases for the descending portion of the sine wave. By finding the intersection of the sine wave with each of the vertical lines representing the fingers, one can determine the needed phase shift for each finger by reading the phases on the left for the ascending portion of the wave and reading the phases on the right for the descending portion of the wave. In FIG. 8A the phase shifts for fingers 0 through 15 are: 0, 180, 0, 180, 0, 180, 0, 180, 0, 180, 0, 180, 0, 180, 0, and 180. FIG. 8A represents a simple case because the finger spacing is one half the wavelength of the sine wave.

FIG. 8B shows a sine wave of a higher frequency than that of FIG. 8A. The phase for each finger can be obtained using the same technique as used for FIG. 8A. In FIG. 8B the phase shifts for fingers 0 through 15 are: 0, 240, 160, 5, 270, 170, 25, 305, 180, 55, 335, 190, 90, 355, 200, and 120 degrees. The available phases shown in FIG. 7 are 0,45, 90,135,180, 225, 270 and 315 degrees. By assigning the closest available phase shift from FIG. 7 to the desired phase shifts in FIG. 8B, one obtains 0, 225, 180, 0, 270, 180, 45, 315, 180, 45, 315,180, 90, 0, 215 and 135 degrees. The use of mathematical curve fitting techniques are also possible. In cases where more precision is needed, modifications to the circuit of FIG. 5 can add additional phases or adjustable delays/phase-shifts to reduce the difference between the desired and available phases.

FIG. 8C shows a sine wave of a lower frequency than that of FIG. 8A. The phase for each finger can be obtained using the same technique as used for FIG. 8A. In FIG. 8C the phase shifts for fingers 0 through 15 are: 0, 120, 205, 355, 90, 190, 335, 55, 180, 305, 25, 170, 270, 5, 155, and 240 degrees. The available phases shown in FIG. 7 are 0, 45, 90, 135, 180, 225, 270 and 315 degrees. By assigning the closest available phase shift from FIG. 7 to the desired phase shifts in FIG. 8C one obtains 0, 135, 215, 0, 90, 180, 315, 45, 180, 315, 45, 180, 270, 0, 135 and 225 degrees. The use of mathematical curve fitting techniques are also possible. Waveforms representing other frequencies are treated in a manner similar to those shown in FIGS. 8B and 8C.

Figure 8D:
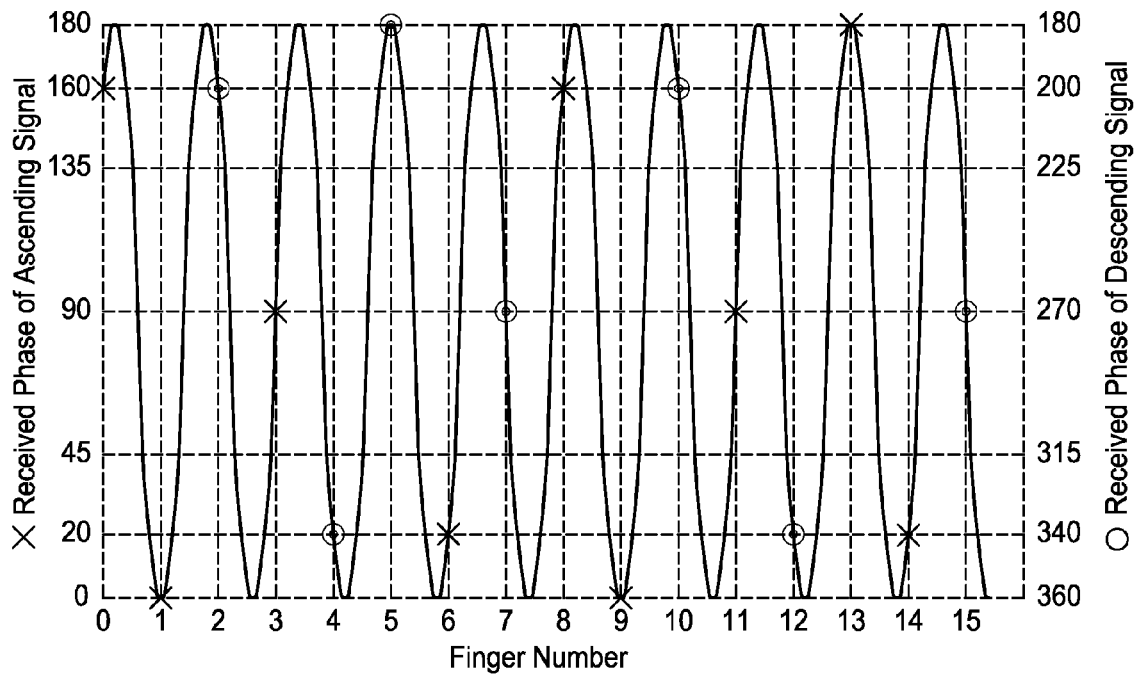
FIG. 8D depicts a received waveform superimposed on a set of interdigitated fingers.

FIG. 8D shows a graphical means to determine the phase for each receiving finger given a desired frequency. FIG. 8D represents a signal with a delay between the transmitting and receiving fingers such that the signal arrives at the first receiving finger with a phase angle of 160 degrees delayed from the phase of the input signal. This delay/phase shift is determined from the distance between the transmitting and receiving fingers and the propagation velocity of the acoustic wave. In order to rotate the phase of this signal so that it is in phase with the input signal, it is necessary to insert a phase delay corresponding to (360°-160°) or 200°. Selecting from the available phases of FIG. 7, the closest matching phase is 180°, corresponding to (360°-180°). The same algorithm is applied to the received signal from all of the fingers. The use of mathematical curve fitting techniques are also possible. Various curve fitting techniques can be used to reduce the mean of the errors between the desired and available phase shifts. Waveforms representing other receive frequencies are treated in a manner similar to those shown in FIG. 8D.

Figure 9:
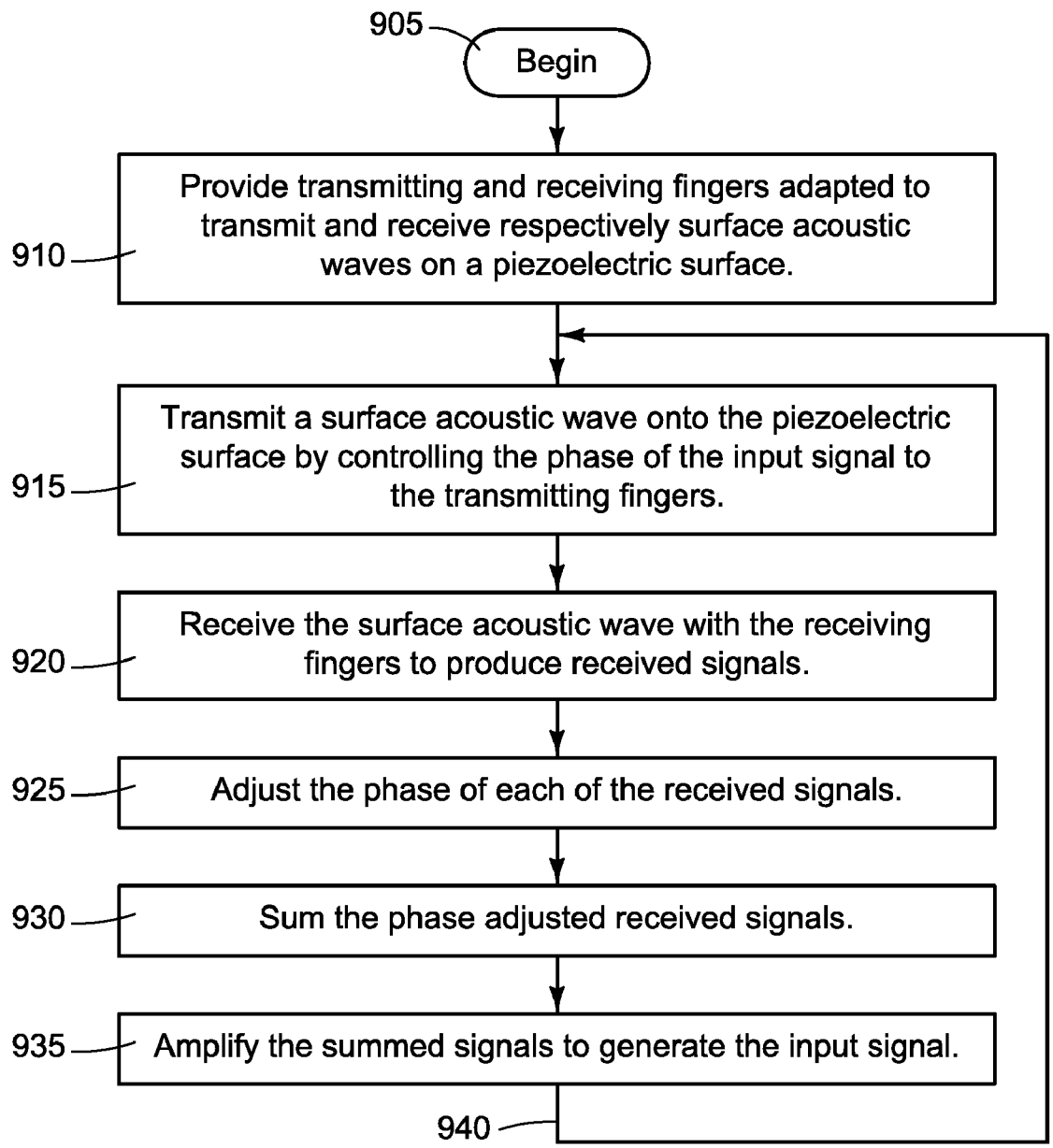
FIG. 9 is a flow chart of a method implementing the frequency adjustable surface acoustic wave oscillator.

FIG. 9 is a flowchart depicting a method of implementing a frequency adjustable surface acoustic wave oscillator. It is to be understood that while the method depicted by the flowchart of FIG. 9 describes particular steps and order of execution, other embodiments and order of execution can also be used. The method begins at 905. Step 910 provides transmitting and receiving fingers adapted to transmit and receive respectively surface acoustic waves on a piezoelectric surface. Step 915 transmits a surface acoustic wave onto the piezoelectric surface by controlling the phase of an input signal to the transmitting fingers. Step 920 receives the surface acoustic wave with the receiving fingers to produce received signals. Step 925 adjusts the phase of each of the received signals. Step 930 sums the phase adjusted received signals. Step 935 amplifies the summed signals to generate the input signal. The continuous nature of this method is indicated by the loop 940.

Steps 915 and 925 adjust the phase of the signals associated with the transmitting and receiving fingers respectively. Some of the several methods to accomplish this phase adjustment were described in the discussion associated with FIGS. 1, 2, 3, 4, 5, and 7. For example, the embodiment of FIG. 5 can be described as a method where the input signal or a received signal is multiplied by a gain factor which is a negative number (inverted), zero (turned off) or positive number (turned on); and a delayed or phase-shifted version of the input signal is multiplied by another negative number, zero or positive number. A simple gain factor is represented by two binary bits. A binary value of 00 turns off both of the switches 541 and 542 of FIG. 5 resulting in a gain of zero. A binary value of 10 turns on switch 541 resulting in a gain of one by passing a non-inverted value of the input 151. A binary value of 01 turns on switch 542 resulting in a gain of negative one passing an inverted value of the input 151. The sum of the two resulting signals is a phase adjusted version of the original signal. Since in this embodiment there are 8 allowable states of switches 541-544, these can be controlled by 3 binary bits and appropriate logic.

Although this invention has been described in terms of certain preferred embodiments, other embodiments that are apparent to those of ordinary skill in the art, including embodiments that do not provide all of the features and advantages set forth herein, are also within the scope of this invention. Rather, the scope of the present invention is defined only by reference to the appended claims and equivalents thereof.

What is claimed is:
1. A frequency adjustable surface acoustic wave oscillator comprising:
  a piezoelectric material;
  a plurality of transmitting fingers interfacing with a first portion of the piezoelectric material, the plurality of transmitting fingers configured to initiate a surface acoustic wave on the piezoelectric material;
  a plurality of receiving fingers interfacing with a second portion of the piezoelectric material, the plurality of receiving fingers configured to receive the surface acoustic wave and generate an electrical signal;
  a plurality of phase adjustable drivers, each of the plurality of phase adjustable drivers having a driver input and a driver output, the driver output of each of the plurality of phase adjustable drivers connected to one of the plurality of transmitting fingers;

each of the plurality of phase adjustable drivers further comprising:
  a driver summing block having inputs and an output;
  a first adjustable gain amplifier having an input and an output, the input connected to the driver input, the output connected to an input of the driver summing block;
  a second adjustable gain amplifier having an input and an output, the input receiving a phase-shifted version of the driver input via a phase-shifter, and the output connected to an input of the driver summing block; and
  the output of the driver summing block connected to the driver output of the phase adjustable driver;
a plurality of phase adjustable receivers, each of the plurality of phase adjustable receivers having a receiver input and receiver output, the receiver input connected to one of the plurality of receiving fingers;
a receiver summing network adapted to sum the receiver output from each of the plurality of phase adjustable receivers and produce a receiver summed output; and
a gain element adapted to receive the receiver summed output, the gain element having an output adapted to excite the driver inputs.

2. A frequency adjustable surface acoustic wave oscillator comprising:
a piezoelectric material;
a plurality of transmitting fingers interfacing with a first portion of the piezoelectric material, the plurality of transmitting fingers configured to initiate a surface acoustic wave on the piezoelectric material;
a plurality of receiving fingers interfacing with a second portion of the piezoelectric material, the plurality of receiving fingers configured to receive the surface acoustic wave and generate an electrical signal;
a plurality of phase adjustable drivers, each of the plurality of phase adjustable drivers having a driver input and a driver output, the driver output of each of the plurality of phase adjustable drivers connected to one of the plurality of transmitting fingers;
a plurality of phase adjustable receivers, each of the plurality of phase adjustable receivers having a receiver input the receiver input connected to one of the plurality of receiving fingers;
a common in-phase summing block having inputs and an output;
a common phase-shifted summing block having inputs and an output;
a receiver summing block adapted to receive the common in-phase summing block output and the common phase-shifted summing block output via a phase-shifter to produce a receiver summed output;
each of the plurality of phase adjustable receivers further comprising:
  two adjustable gain amplifiers, the inputs of the adjustable gain amplifiers connected to one of the plurality of receiving fingers;
  the output of one adjustable gain amplifier connected to an input of the common in-phase summing block;
  the output of the other adjustable gain amplifier connected to an input of the common phase-shifted summing block; and
a gain element adapted to receive the receiver summed output, the gain element having an output adapted to excite the driver inputs.

3. A frequency adjustable surface acoustic wave oscillator comprising:
a piezoelectric material;
a plurality of transmitting fingers interfacing with a first portion of the piezoelectric material, the plurality of transmitting fingers configured to initiate a surface acoustic wave on the piezoelectric material;
a plurality of receiving fingers interfacing with a second portion of the piezoelectric material, the plurality of receiving fingers configured to receive the surface acoustic wave and generate an electrical signal;
a plurality of phase adjustable drivers, each of the plurality of phase adjustable drivers having a driver output, the driver output of each of the plurality of phase adjustable drivers connected to one of the plurality of transmitting fingers;
a plurality of phase adjustable receivers, each of the plurality of phase adjustable receivers having a receiver input and receiver output, the receiver input connected to one of the plurality of receiving fingers;
a receiver summing network adapted to sum the receiver output from each of the plurality of phase adjustable receivers and produce a receiver summed output;
a tapped delay having an input and a plurality of taps;
each of the phase adjustable drivers further comprising:
  a summing block having inputs and an output;
  a plurality of switches, each of the plurality of switches interposed between one of the taps of the tapped delay, and one of the inputs of the summing block;
  the output of the summing block connected to the output of the phase adjustable driver; and
a gain element adapted to receive the receiver summed output, the gain element having an output adapted to excite the input of the tapped delay line.

4. The frequency adjustable surface acoustic wave oscillator of claim 1 wherein the adjustable gain amplifiers have a gain ranging from negative to positive.

5. The frequency adjustable surface acoustic wave oscillator of claim 1 wherein the spacing between each of the plurality of transmitting fingers is substantially one half of the wavelength of the geometric mean of an upper and a lower operating frequency of the frequency adjustable surface acoustic wave oscillator.

6. The frequency adjustable surface acoustic wave oscillator of claim 2 wherein the spacing between each of the plurality of receiving fingers is substantially one half of the wavelength of the geometric mean of an upper and lower operating frequency of the frequency adjustable surface acoustic wave oscillator.

7. A method of implementing a frequency adjustable surface acoustic wave oscillator the method comprising:
providing transmitting fingers and receiving fingers adapted to transmit and receive respectively surface acoustic waves on a piezoelectric surface;
transmitting a surface acoustic wave onto the piezoelectric surface by controlling the phase of an input signal to each of the transmitting fingers;
wherein the step of controlling the phase of an input signal to each of the transmitting fingers further comprises the steps of:
  multiplying the input signal by a first gain factor;
  multiplying a phase-shifted version of the input signal by a second gain factor; and
  applying the sum of the two resulting signals to a transmitting finger;
receiving the surface acoustic wave with the receiving fingers to produce a plurality of received signals;

adjusting the phase of each of the plurality of received signals;

summing the phase adjusted received signals; and amplifying the summed signals to generate the input signal.

8. A frequency adjustable surface acoustic wave oscillator comprising:

A piezoelectric layer deposited onto a semiconductor;

a plurality of transmitting fingers interfacing with a first portion of the piezoelectric layer, the plurality of transmitting fingers configured to initiate a surface acoustic wave on the piezoelectric layer;

a plurality of receiving fingers interfacing with a second portion of the piezoelectric layer, the plurality of receiving fingers configured to receive the surface acoustic wave;

a plurality of phase adjustable drivers, each of the plurality of phase adjustable drivers further comprising:

a summer, having a summer output and a plurality of summer inputs, the summer output connected to a corresponding one of the plurality of transmitting fingers;

each of the plurality of summer inputs adapted to receive a phase-shifted version of a driver input via a transmitter switch.

a plurality of receiver busses;

a receiver summing system adapted to form a phase-shifted version of each of the receiver busses and form a summed output; and a plurality of phase adjustable receivers, each of the phase adjustable receivers further comprising:

a plurality of receiver switches having inputs and outputs, the inputs of the receiver switches connected to one receiver finger via a buffer, the output of each of the receiver switches connected to one of the plurality of receiver busses;

a gain element adapted to receive the summed output and excite the driver input.

9. The frequency adjustable surface acoustic wave oscillator of claim 8 wherein the phase adjustable drivers and phase adjustable receivers are constructed on the semiconductor.

10. The frequency adjustable surface acoustic wave oscillator of claim 8 further comprising a dielectric layer interposed between the semiconductor and the piezoelectric material.

11. The frequency adjustable surface acoustic wave oscillator of claim 1 wherein the piezoelectric material is selected from the group consisting of zinc oxide, quartz, lithium tantalate, lithium niobate, gallium arsenide, cadmium sulphide, lithium tetraborate, langasite, bismuth germanium oxide, and aluminum nitride.

12. The frequency adjustable surface acoustic wave oscillator of claim 1 wherein the plurality of phase adjustable drivers, plurality of phase adjustable receivers, summing network and gain element are on a common semiconductor substrate.

13. The frequency adjustable surface acoustic wave oscillator of claim 12 wherein the piezoelectric material is deposited onto the surface of the semiconductor substrate.

14. The frequency adjustable surface acoustic wave oscillator of claim 13 further comprising:

a dielectric layer between the piezoelectric material and the semiconductor substrate.

15. The frequency adjustable surface acoustic wave oscillator of claim 2 wherein the piezoelectric material is selected from the group consisting of zinc oxide, quartz, lithium tantalate, lithium niobate, gallium arsenide, cadmium sulphide, lithium tetraborate, langasite, bismuth germanium oxide, and aluminum nitride.

16. The frequency adjustable surface acoustic wave oscillator of claim 2 wherein the plurality of phase adjustable drivers, plurality of phase adjustable receivers, summing network and gain element are on a common semiconductor substrate.

17. The frequency adjustable surface acoustic wave oscillator of claim 16 wherein the piezoelectric material is deposited onto the surface of the semiconductor substrate.

18. The frequency adjustable surface acoustic wave oscillator of claim 17 further comprising:

a dielectric layer between the piezoelectric material and the semiconductor substrate.

19. The frequency adjustable surface acoustic wave oscillator of claim 2 wherein the adjustable gain amplifiers have a gain ranging from negative to positive.

20. The frequency adjustable surface acoustic wave oscillator of claim 2 further comprising:

additional common phase-shifted summing blocks each having inputs and an output;

the receiver summing block adapted to receive the additional common phase-shifted summing block outputs via a plurality of phase-shifters to produce the receiver summed output;

the plurality of phase adjustable receivers further comprising:

additional adjustable gain amplifiers, the inputs of the additional adjustable gain amplifiers connected to the receiver input;

the outputs of each of the additional adjustable gain amplifiers connected to an input of an additional common phase-shifted summing blocks.

21. The frequency adjustable surface acoustic wave oscillator of claim 1 wherein the phase-shifter is common to the phase adjustable drivers.

22. The frequency adjustable surface acoustic wave oscillator of claim 1 wherein each of the plurality of phase adjustable drivers further comprise additional adjustable gain amplifiers having inputs and outputs, the inputs of the amplifiers receiving phase shifted versions of the driver input via phase shifters common to all the phase adjustable drivers, and the outputs of the amplifiers connected to the inputs of the driver summing block associated with each respective phase adjustable driver.

* * * * *